US009892910B2

United States Patent
Cheng et al.

(10) Patent No.: US 9,892,910 B2
(45) Date of Patent: Feb. 13, 2018

(54) METHOD AND STRUCTURE FOR FORMING A DENSE ARRAY OF SINGLE CRYSTALLINE SEMICONDUCTOR NANOCRYSTALS

(71) Applicant: International Business Machines Corporation, Armonk, NY (US)

(72) Inventors: Kangguo Cheng, Schenectady, NY (US); Hong He, Schenectady, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 68 days.

(21) Appl. No.: 14/713,099

(22) Filed: May 15, 2015

(65) Prior Publication Data

US 2016/0336176 A1   Nov. 17, 2016

(51) Int. Cl.
*H01L 29/06* (2006.01)
*H01L 31/00* (2006.01)
*H01L 21/02* (2006.01)
*H01L 21/311* (2006.01)
*H01L 29/775* (2006.01)
*H01L 29/66* (2006.01)
(Continued)

(52) U.S. Cl.
CPC .. *H01L 21/02488* (2013.01); *H01L 21/02521* (2013.01); *H01L 21/02601* (2013.01); *H01L 21/02603* (2013.01); *H01L 21/02667* (2013.01); *H01L 21/31111* (2013.01); *H01L 27/1203* (2013.01); *H01L 29/0649* (2013.01); *H01L 29/0665* (2013.01); *H01L 29/0673* (2013.01); *H01L 29/1054* (2013.01); *H01L 29/66439* (2013.01); *H01L 29/775* (2013.01)

(58) Field of Classification Search
CPC ........... H01L 21/02667; H01L 29/0665; H01L 27/1203; H01L 21/02601
USPC .......................................................... 438/128
See application file for complete search history.

(56) References Cited

U.S. PATENT DOCUMENTS 5,854,123 A * 12/1998 Sato .................. H01L 21/76254
257/E21.318
6,090,666 A * 7/2000 Ueda ...................... B82Y 10/00
117/87
6,936,505 B2   8/2005 Keys et al.
(Continued)

FOREIGN PATENT DOCUMENTS

CN        102502778 A      6/2012
WO    WO2008045114 A2     4/2008

*Primary Examiner* — Olik Chaudhuri
*Assistant Examiner* — Wilner Jean Baptiste
(74) *Attorney, Agent, or Firm* — Scully, Scott, Murphy & Presser, P.C.; Steven J. Meyers

(57) ABSTRACT

A dense array of semiconductor single crystalline semiconductor nanocrystals is provided in the present application by forming an amorphous semiconductor material layer surrounding a plurality of patterned nanostructures comprised of a single crystalline semiconductor material portion. A thermal anneal, i.e., (solid phase epitaxy), is then performed to crystallize a portion of the amorphous semiconductor material layer that is in contact with each single crystalline semiconductor material portion and to provide a plurality of spaced apart single crystalline nanocrystals on a surface of an insulator. A remaining portion of the amorphous semiconductor material layer that was not crystallized is thereafter removed.

10 Claims, 6 Drawing Sheets

(51) Int. Cl.
*H01L 27/12* (2006.01)
*H01L 29/10* (2006.01)

(56) References Cited

U.S. PATENT DOCUMENTS

| | | | |
|---|---|---|---|
| 8,129,211 B2 | 3/2012 | Kim et al. | |
| 8,617,407 B2 | 12/2013 | Hantschel et al. | |
| 9,431,483 B1 * | 8/2016 | Wen | H01L 29/0673 |
| 2005/0151193 A1 * | 7/2005 | Wong | H01L 27/1203 |
| | | | 257/347 |
| 2005/0287717 A1 * | 12/2005 | Heald | B82Y 10/00 |
| | | | 438/128 |
| 2010/0155786 A1 * | 6/2010 | Heald | G03F 7/0754 |
| | | | 257/213 |
| 2010/0155844 A1 * | 6/2010 | Takahashi | H01L 21/28097 |
| | | | 257/348 |
| 2011/0006348 A1 * | 1/2011 | Cho | B82Y 10/00 |
| | | | 257/252 |
| 2015/0228789 A1 * | 8/2015 | Basker | H01L 29/7848 |
| | | | 257/401 |

* cited by examiner

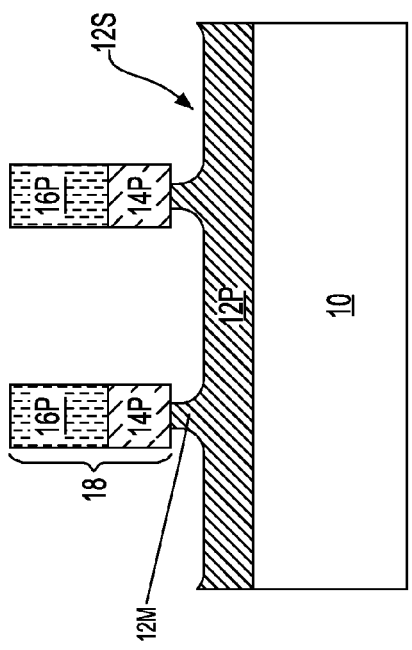
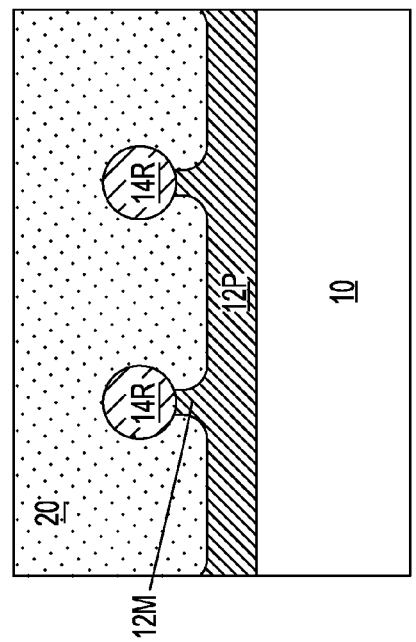
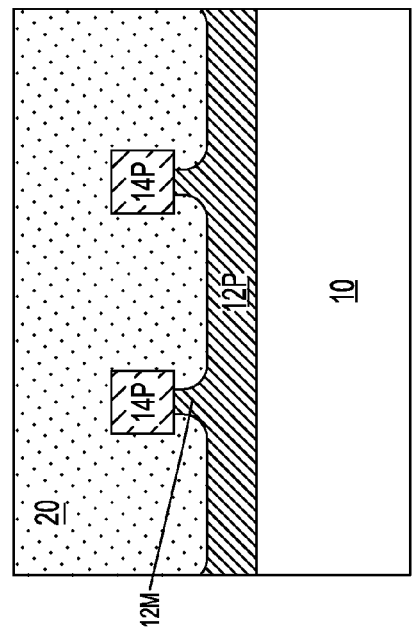

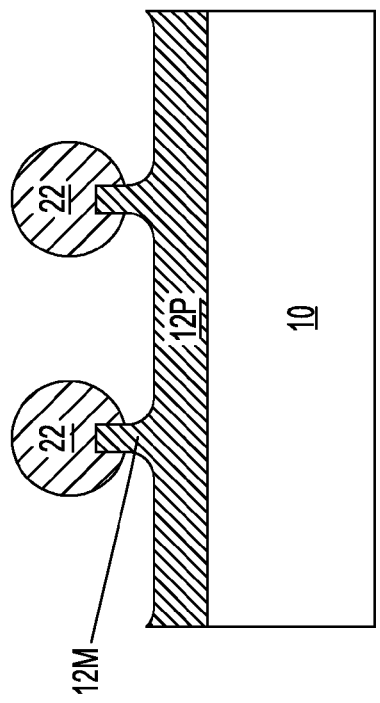
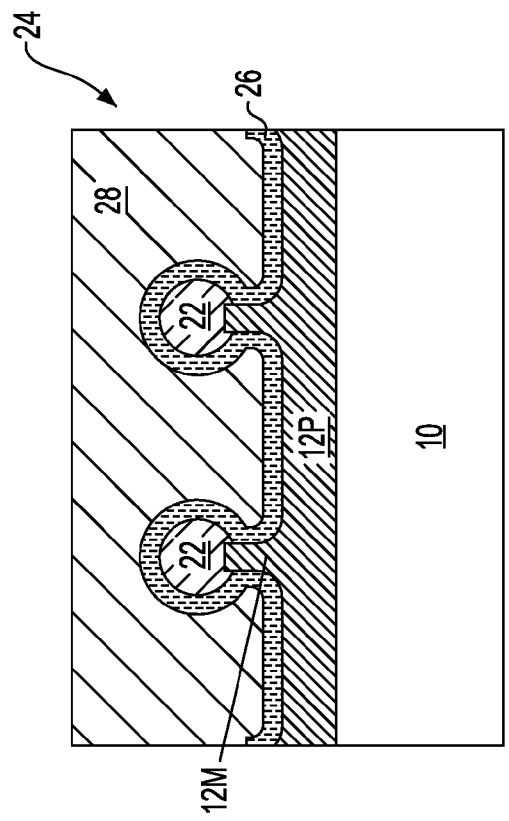
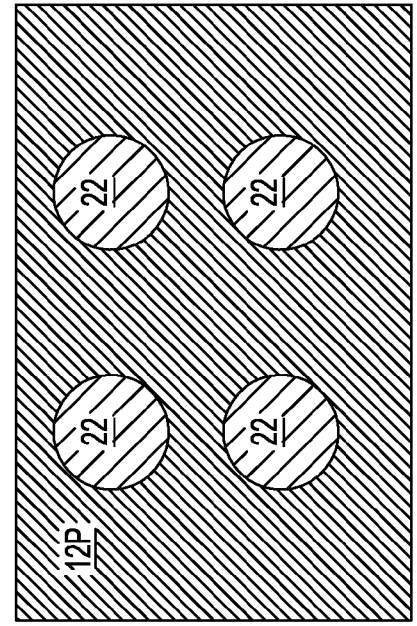

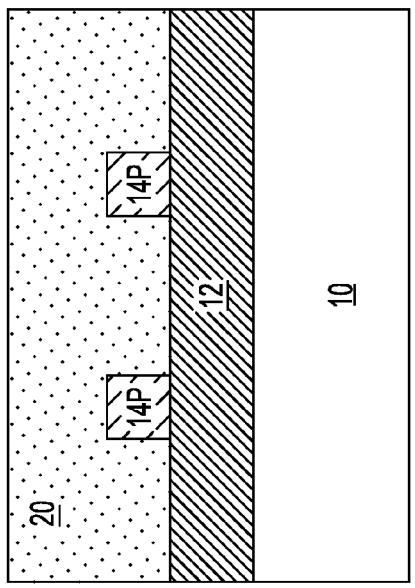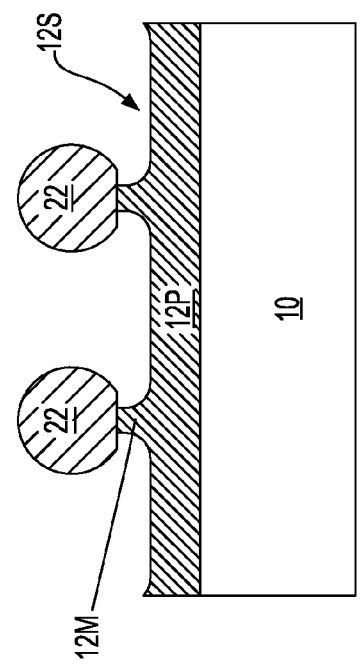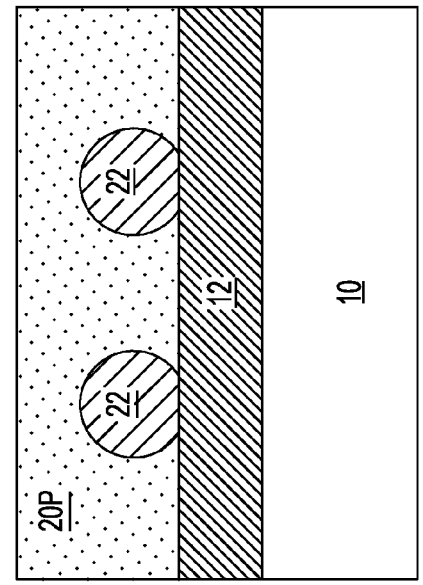

METHOD AND STRUCTURE FOR FORMING A DENSE ARRAY OF SINGLE CRYSTALLINE SEMICONDUCTOR NANOCRYSTALS

BACKGROUND

The present application relates to a semiconductor structure and a method of forming the same. More particularly, the present application relates to a method of forming a semiconductor structure containing a dense array of single crystalline semiconductor nanocrystals (i.e., nanorods or nanoballs) located on a surface of an insulator utilizing solid phase epitaxy (SPE).

For more than three decades, the continued miniaturization of metal oxide semiconductor field effect transistors (MOSFETs) has driven the worldwide semiconductor industry. Various showstoppers to continue scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

Semiconductor nanocrystals such as, for example, nanoballs and nanorods, have attracted substantial attention due to their potential applications in photonics and sensing technologies. Semiconductor nanocrystals are crystalline semiconductor particles with at least one dimension measuring less than 100 nm. For use in future semiconductor technologies, it is critical to control the size of the nanocrystal below 20 nm and to precisely align the nanocrystals in dense arrays.

In view of the above, there is a need for providing a method of forming semiconductor nanocrystals, i.e., nanoballs and nanorods, that may, in some instances, have a size that is less than 20 nm, and that can be arranged in a dense array.

SUMMARY

A dense array of single crystalline semiconductor nanocrystals is provided in the present application by forming an amorphous semiconductor material layer surrounding a plurality of patterned nanostructures comprised of a single crystalline semiconductor material portion. A thermal anneal, i.e., (solid phase epitaxy), is then performed to crystallize a portion of the amorphous semiconductor material layer that is in contact with each single crystalline semiconductor material portion and to provide a plurality of spaced apart single crystalline nanocrystals on a surface of an insulator. A remaining portion of the amorphous semiconductor material layer that was not crystallized is thereafter removed.

In one aspect of the present application, a method of forming a semiconductor structure is provided. In accordance with an embodiment of the present application, the method of the present application may include forming a plurality of single crystalline semiconductor material portions on an insulator layer. Next, an amorphous semiconductor material layer is formed on exposed surfaces of each single crystalline semiconductor material portion. A thermal anneal is then performed to crystallize a portion of the amorphous semiconductor material layer that is in contact with the exposed surfaces of each single crystalline semiconductor material portion and to provide a plurality of spaced apart single crystalline semiconductor nanocrystals. A remaining non-crystallized portion of the amorphous semiconductor material layer is then removed.

In another aspect of the present application, a semiconductor structure is provided. In accordance with an embodiment of the present application, the semiconductor structure of the present application includes a plurality of single crystalline semiconductor nanocrystals located on a mesa structure of an insulator layer portion. The insulator layer portion has an undulating surface and a portion of said mesa structure protrudes into a portion of each of said single crystalline semiconductor nanocrystals. In some embodiments of the present application, each single crystalline semiconductor nanocrystal of the plurality of single crystalline semiconductor nanocrystals has a diameter of less than 20 nm, and is spaced apart for its nearest neighboring single crystalline semiconductor nanocrystal by a distance of 20 nm or less.

In another embodiment, the semiconductor structure of the present application includes a plurality of single crystalline semiconductor nanocrystals located on a mesa structure of an insulator layer portion. The insulator layer portion has an undulating surface and wherein an entire bottommost surface of each of the single crystalline semiconductor nanocrystals is present on a topmost surface of the mesa structure. In some embodiments of the present application, each single crystalline semiconductor nanocrystal of the plurality of single crystalline semiconductor nanocrystals has a diameter of less than 20 nm, and is spaced apart for its nearest neighboring single crystalline semiconductor nanocrystal by a distance of 20 nm or less.

BRIEF DESCRIPTION OF SEVERAL VIEWS OF THE DRAWINGS

FIG. 4 is a cross sectional view of the exemplary semiconductor structure of FIG. 3 after etching the exposed surface of the insulator layer to provide a mesa structure located beneath each pillar and extending upwards from a remaining portion of the insulator layer.

FIG. 5A is a cross sectional view of the exemplary semiconductor structure of FIG. 4 after removing each hard mask portion from above each single crystalline semiconductor material portion and forming an amorphous semiconductor material layer contacting exposed surfaces of each single crystalline semiconductor material portion.

FIG. 5B is a cross sectional view of the exemplary semiconductor structure of FIG. 4 after removing each hard mask portion from above each single crystalline semiconductor material portion, reshaping each single crystalline semiconductor material portion and forming an amorphous semiconductor material layer contacting exposed surfaces of each single crystalline semiconductor material portion

FIG. 7A is a cross sectional view of the exemplary semiconductor structure of FIG. 6A after removing a remaining portion of the amorphous semiconductor material layer that was not crystallized during the solid phase epitaxy.

FIG. 7B is a top down view of the exemplary semiconductor structure shown in FIG. 7A.

FIG. 8 is a cross sectional view of the exemplary semiconductor structure of FIG. 7A after forming a functional gate structure straddling each single crystalline semiconductor nanoball.

FIG. 9 is a cross sectional view of the exemplary semiconductor structure of FIG. 3 after removing each hard mask portion from above each single crystalline semiconductor material portion and forming an amorphous semiconductor material layer in contact with exposed surfaces of each single crystalline semiconductor material portion in accordance with alternative embodiment of the present application.

FIG. 10 is a cross sectional view of the exemplary semiconductor structure of FIG. 11 after performing solid phase epitaxy to provide a plurality of single crystalline semiconductor nanoballs on the insulator layer.

FIG. 11 is a cross sectional view of the exemplary semiconductor structure of FIG. 10 after removing a remaining portion of the amorphous semiconductor material layer and after etching the exposed surface of the insulator layer to provide a mesa structure located beneath each nanoball and extending upwards from a remaining portion of the insulator layer.

DETAILED DESCRIPTION

Figure 1:
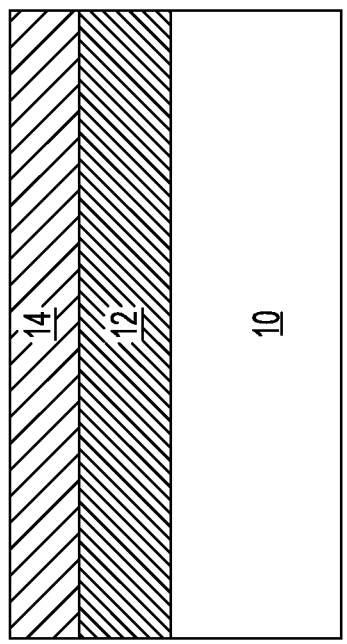
FIG. 1 is a cross sectional view of an exemplary semiconductor structure including, from bottom to top, a handle substrate, an insulator layer, and a single crystalline semiconductor material layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

As stated above, the present application provides a method of forming a dense array of semiconductor single crystalline semiconductor nanocrystals (i.e., nanoballs or nanorods) by forming an amorphous semiconductor material layer surrounding a plurality of patterned nanostructures comprised of a single crystalline semiconductor material portion. A thermal anneal, i.e., (solid phase epitaxy), is then performed to crystallize a portion of the amorphous semiconductor material layer that is in contact with each single crystalline semiconductor material portion and to provide a plurality of spaced apart single crystalline nanocrystals on a surface of an insulator. A remaining portion of the amorphous semiconductor material layer that was not crystallized is thereafter removed.

The method of the present application to be described in further detail herein below can advantageously provide a means for precisely controlling the dimension, i.e., size, of each single crystalline semiconductor nanocrystal by changing the seeds, i.e., material of either the patterned nanostructures or amorphous semiconductor material layer, and solid phase epitaxy (SPE) conditions. Moreover, the method of the present application can provide large area well-aligned single crystalline semiconductor nanocrystals. Also, the method of the present application is compatible with existing complementary metal oxide semiconductor (CMOS) technology rendering the potential integration of photonics/sensing with CMOS on the same semiconductor chip.

Referring first to FIG. 1, there is illustrated an exemplary semiconductor structure including, from bottom to top, a handle substrate 10, an insulator layer 12, and a single crystalline semiconductor material layer 14 that can be employed in the present application. The handle substrate 10 provides mechanical support for the insulator layer 12 and the single crystalline semiconductor material layer 14. The exemplary semiconductor structure (10, 12, 14) may be referred to herein as a semiconductor-on-insulator substrate.

In some embodiments of the present application, the handle substrate 10 and the single crystalline semiconductor material layer 14 of the SOI substrate may comprise a same, or a different, semiconductor material. In the present application the single crystalline semiconductor material layer 14 represents a first semiconductor material, while the amorphous semiconductor material layer to be subsequently formed represents a second semiconductor material.

The term "semiconductor" as used herein in connection with the semiconductor material of the handle substrate 10 and the single crystalline semiconductor material layer 14 denotes any semiconductor material including, for example, Si, Ge, SiGe, SiC, SiGeC, a II/VI compound semiconductor or a III/V compound semiconductor such as, for example, InAs, GaAs, or InP. In one embodiment, the handle substrate 10 and the single crystalline semiconductor material layer 14 are both comprised of silicon. In some embodiments, the handle substrate 10 is a non-semiconductor material including, for example, a dielectric material and/or a conductive material. In yet other embodiments, the handle substrate 10 can be omitted and a substrate including insulator layer 12 and single crystalline semiconductor material layer 14 can be used in the present application.

In some embodiments, the handle substrate 10 and the single crystalline semiconductor material layer 14 may have a same, or a different, crystal orientation. For example, the crystal orientation of the handle substrate 10 and/or the single crystalline semiconductor material layer 14 may be {100}, {110}, or {111}. Other crystallographic orientations besides those specifically mentioned can also be used in the present application. It is noted that the crystal orientation of the single semiconductor material layer 14 will determine the crystal orientation of the subsequently formed single crystalline semiconductor nanocrystal since solid phase epitaxy is used in providing each single crystalline semiconductor nanocrystal. The handle substrate 10 may be a single crystalline semiconductor material, a polycrystalline material, or an amorphous material. The single crystalline semiconductor material layer 14 is comprised of a crystalline semiconductor material. In some embodiments (not shown), the single crystalline semiconductor material layer 14 that is located atop the insulator layer 12 can be processed to include semiconductor regions having different crystal orientations.

The insulator layer 12 of the exemplary semiconductor structure shown in FIG. 1 may be a crystalline or non-crystalline oxide or nitride. In one embodiment, the insulator layer 12 is an oxide such as, for example, silicon dioxide. In another embodiment, the insulator layer 12 is a nitride such as, for example, silicon nitride or boron nitride. In yet still another embodiment of the present application, the insulator layer 12 may be a multilayered structure such as a stack of, in any order, silicon dioxide and boron nitride.

The exemplary semiconductor structure including the handle substrate 10, insulator 12, and the single crystalline semiconductor material layer 14 may be formed utilizing standard processes known in the art. For one example, the exemplary semiconductor structure shown in FIG. 1 may be formed by a SIMOX (Separation by IMplantation of OXygen). In another example, a layer transfer process may be used to provide the exemplary semiconductor structure shown in FIG. 1.

The thickness of the single crystalline semiconductor material layer 14 that can be used in the present application can be from 3 nm to 15 nm. Other thicknesses that are lesser than, or greater than, the aforementioned range can also be employed in the present application. If the initial thickness of the single crystalline semiconductor material layer 14 is not in a range that is desired, a thinning step such as, for example, planarization or etching can be used to reduce the thickness of the single crystalline semiconductor material layer 14 to a value within a desired range prior to further processing.

The thickness of the insulator layer 12 of the exemplary semiconductor structure shown in FIG. 1 and the may be used in the present application can be from 10 nm to 200 nm. Other thicknesses that are lesser than, or greater than, the aforementioned thickness range for the insulator layer 12 can be used in the present application. The thickness of the handle substrate 10 of the exemplary semiconductor structure shown in FIG. 1 is inconsequential to the present application.

Figure 2:
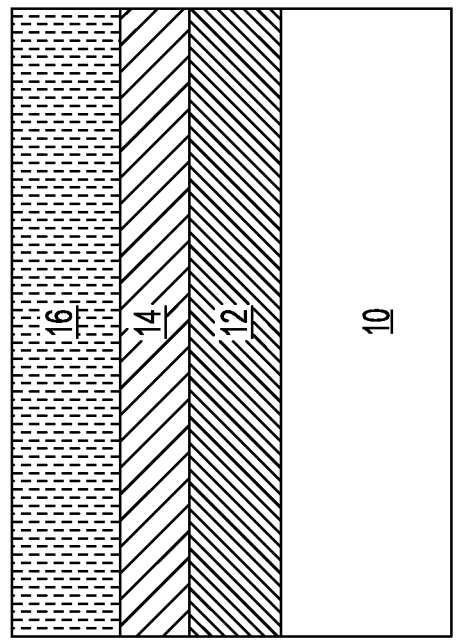
FIG. 2 is a cross sectional view of the exemplary semiconductor structure of FIG. 1 after forming a hard mask layer on the single crystalline semiconductor material layer.

Referring now to FIG. 2, there is illustrated the exemplary semiconductor structure of FIG. 1 after forming a hard mask layer 16 on the single crystalline semiconductor material layer 14. The hard mask layer 16 is a contiguous material layer that covers an entirety of the single crystalline semiconductor material layer 14 shown in FIG. 1.

The hard mask material that can be employed in the present application as hard mask layer 16 may include a semiconductor oxide, a semiconductor nitride and/or a semiconductor oxynitride. In one embodiment, the hard mask material that can be used in the present application as the hard mask layer 16 may be comprised of silicon dioxide. In another embodiment, the hard mask material that can be used in the present application as the hard mask layer 16 may be comprised of silicon nitride. In yet another embodiment, the hard mask material that can be used in the present application as the hard mask layer 16 may include a hard mask stack of, in any order, silicon dioxide and silicon nitride.

In some embodiments, the hard mask material that can be used in the present application as the hard mask layer 16 can be formed by a deposition process such as, for example, chemical vapor deposition (CVD) or plasma enhanced chemical vapor deposition (PECVD). In other embodiments, the hard mask material that can be used in the present application as the hard mask layer 16 may be formed by a thermal process such as, for example, thermal oxidation and/or thermal nitridation. In yet other embodiments, the hard mask material that can be used in the present application as the hard mask layer 16 may be formed by a combination of a deposition process and a thermal process. The thickness of the hard mask material that can be used in the present application as the hard mask layer 16 may range from 2 nm to 10 nm, with a thickness from 3 nm to 6 nm being more typical.

Figure 3:
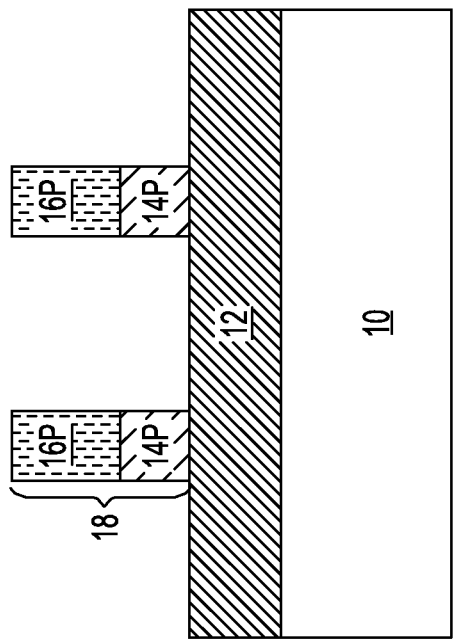
FIG. 3 is a cross sectional view of the exemplary semiconductor structure of FIG. 2 after patterning the hard mask layer and the single crystalline semiconductor material layer to provide a plurality of pillars extending upwards from the insulator layer, wherein each pillar contains, from bottom to top, a single crystalline semiconductor material portion and a hard mask portion.

Referring now to FIG. 3, there is illustrated the exemplary semiconductor structure of FIG. 2 after patterning the hard mask layer 16 and the single crystalline semiconductor material layer 14 to provide a plurality of pillars 18 (i.e., patterned nanostructure structures) extending upwards from the insulator layer 12. In accordance with the present application, each pillar 18 that is formed contains, from bottom to top, a single crystalline semiconductor material portion 14P and a hard mask portion 16P. Each single crystalline semiconductor material portion 14P represents a remaining portion of the single crystalline semiconductor material layer, while each hard mask portion 16P represents a remaining portion of the hard mask layer 16.

In one embodiment, the patterning process used to define each patterned nanostructure, i.e., pillar 18, comprises a sidewall image transfer (SIT) process. The SIT process includes forming a contiguous mandrel material layer (not shown) on the hard mask layer 16. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching. Since the dielectric spacers are used in the SIT process as an etch mask, the width of the each dielectric spacer determines the width of each patterned nanostructure (i.e., pillar 18).

After formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers entirely through the hard mask layer 16 and entirely through the underlying the single crystalline semiconductor material layer 14. The pattern transfer may be achieved by utilizing at least one etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In another embodiment, the patterning process used to define each patterned nanostructure (i.e., pillar 18) can include lithography and etching. Lithography includes forming a photoresist material (not shown) on the hard mask layer 16. The photoresist material can be formed utilizing a deposition process such as, for example, spin-on coating, evaporation, or chemical vapor deposition. Following the deposition of the photoresist material, the photoresist material is exposed to a pattern of irradiation, and thereafter the exposed resist material is developed utilizing a conventional resist developer to provide a patterned photoresist material. At least one etch as mentioned above for the SIT process can be used here to complete the pattern transfer. Following at least one pattern transfer etch process, the patterned photoresist material can be removed from the structure utilizing a conventional resist stripping process such as, for example, ashing.

As used herein, a "pillar" refers to a patterned nanostructure whose height is equal to, or greater than, its length. In some embodiments, each pillar 18 is rectangular in shape. The width of each pillar 18 that can be formed in the present application can be from 6 nm to 10 nm. Other widths that are lesser than, or greater than, the range mentioned above can also be employed in the present application for each pillar 18. The length of each pillar 18 (which would run into and out of the plane of the drawing shown in FIG. 3) that can be formed in the present application is from 10 nm up to and including 200 nm. Other lengths that are lesser than, or greater than, the aforementioned range may also be employed as the length of each pillar 18. Each pillar 18 that is formed at this point of the present application is spaced apart from its nearest neighboring pillar by a distance of from 20 nm to 100 nm; this distance can be measured from a central portion of one of the pillars to a central portion of a neighboring pillar. Other distances that are lesser than, or greater than, the aforementioned distance range between neighboring pillars 18 can also be employed in the present application.

Referring now FIG. 4, there is illustrated the exemplary semiconductor structure of FIG. 3 after etching the exposed surface of the insulator layer 12 not protected by the pillar 18 to provide a mesa structure 12M located beneath each pillar 18 and extending upwards from a remaining portion of the insulator layer 12; the remaining portion of the insulator layer 12 can be referred to herein as insulator layer portion 12P. As is shown, the insulator layer portion 12P now has an undulating surface 12S. By "undulating surface" it is meant that the insulating layer portion 12P has a wavy surface that contains a series of peaks (defined by the mesa structure 12M) and valleys (located beneath each mesa structure 12M).

The etching of the exposed surface of the insulator layer 12 may be performed utilizing an isotropic etching process that is selective in removing the material that provides the insulator layer 12 relative to the single crystal semiconductor material portion 14P. In one example, the isotropic etch may include a buffered oxide etch such as, for example, ammonium fluoride ($NH_4F$) or hydrofluoric acid (HF).

Each mesa structure 12M and the remaining insulator layer portion 12P are of unitary construction and are comprised of the same material. Each mesa 12M that is provided has sidewall surfaces that do not extend beyond the sidewall surfaces of the pillar 18. Thus, the above mentioned etching process may be referred to as an undercut etching process.

Referring now to FIG. 5A, there is illustrated the exemplary semiconductor structure of FIG. 4 after removing each hard mask portion 16P from above each single crystalline semiconductor material portion 14P and forming an amorphous semiconductor material layer 20 surrounding and in contact with exposed surfaces of each single crystalline semiconductor material portion 14P. As is shown, the amorphous semiconductor material layer 20 contacts sidewall surfaces, a topmost surface and a portion of the bottommost surface of each single crystalline semiconductor material portion 14P as well as exposed portions of mesa structure 12M and the insulator layer portion 12P.

In one embodiment of the present application, each hard mask portion 16P can be removed utilizing a planarization process such as, for example, chemical mechanical polishing (CMP) and/or grinding. In another embodiment of the present application, each hard mask portion 16P can be removed utilizing an etching process that selectively removes the hard mask material relative to that of the insulator layer 12 and the single crystalline semiconductor material layer 14. In one example, and when the hard mask material comprises silicon nitride, phosphoric acid ($H_3PO_4$) can be used as the etchant for removing each hard mask portion 16P. In one embodiment (not shown), the hardmask portion 16P can be removed after pillar 18 formation, but before etching the insulator layer 12.

The amorphous semiconductor material layer 20 comprises a second semiconductor material. In one embodiment of the present application, the second semiconductor material that provides the amorphous semiconductor material layer 20 may be a same semiconductor material as the first semiconductor material that provides the single crystalline semiconductor material portion 14P. In one example, the amorphous semiconductor material layer 20 and the single crystalline semiconductor material portion 14P both comprise silicon or a silicon germanium alloy. In such an embodiment, the entirety of each single crystalline semiconductor nanocrystal that is to be subsequently formed will comprise a single semiconductor material, e.g., silicon or a silicon germanium alloy.

In another embodiment of the present application, the second semiconductor material that provides the amorphous semiconductor material layer 20 may be a different semiconductor material that the first semiconductor material that provides the single crystalline semiconductor material portion 14P. In one example, the amorphous semiconductor material layer 20 may be comprised of a silicon germanium alloy, while the single crystalline semiconductor material layer 14 comprises silicon. In such an embodiment, each single crystalline semiconductor nanocrystal that is to be subsequently formed can comprise a core of single crystalline silicon, and a shell of a single crystalline silicon germanium alloy. Besides silicon and silicon germanium, the amorphous semiconductor material layer 20 can include other semiconductor materials such as, for example, germanium, III-V compound semiconductor, II-VI compound semiconductors.

The amorphous semiconductor material layer 20 may be formed by any deposition process that can provide an amorphous semiconductor material. Examples of deposition processes that can be used in providing the amorphous semiconductor material layer 20 include sputtering, physical vapor deposition (PVD), plasma enhanced chemical vapor deposition (PECVD) or inductively coupled plasma chemical vapor deposition (ICP-CVD). The amorphous semiconductor material layer 20 may be deposited utilizing any well known semiconductor material forming precursor. In one example, a silicon containing gas source such as, for example, a silane, may be used as the semiconductor material forming precursor. Carrier gases like hydrogen, nitrogen, helium and argon can be used in conjugation with the semiconductor material forming precursor. The amorphous semiconductor material layer 20 can be deposited at a deposition temperature from 400° C. to 500° C.

The thickness of the amorphous semiconductor material layer 20 that is formed at this point of the present application can be from 50 nm to 500 nm. Other thickness that are lesser than, or greater than, the aforementioned thickness range may also be used in the present application for the amorphous semiconductor material layer 20 as long as the selected thickness covers the entirety of each single crystalline semiconductor material portion 14P.

Referring now to FIG. 5B, there is illustrated the exemplary semiconductor structure of FIG. 4 after removing each hard mask portion 16P from above each single crystalline semiconductor material portion 14P, reshaping each single crystalline semiconductor material portion 14P to provide a reshaped single crystalline semiconductor material portion 14R, and forming an amorphous semiconductor material layer 20 contacting exposed surfaces of each reshaped single crystalline semiconductor material portion 14R. The removal of the hard mask portion 16P and the formation and materials for the amorphous semiconductor layer 20 are the same as described above in providing the exemplary semiconductor structure shown in FIG. 5A.

In this embodiment of the present application and as shown in FIG. 5B, each single crystalline semiconductor material portion 14P can be re-shaped into a single crystalline semiconductor material portion 14R (by way of an example, each reshaped portion 14R is in the form of an oval). For example, sharp corners of a rectangular shaped single crystalline semiconductor material portion 14P can be smoothened by performing a thermal annealing process in a hydrogen environment. Depending on the size of the single crystalline semiconductor material portion 14P and how much smoothing is desired, the anneal temperature can be from 600° C. to 950° C. The annealing pressure can be from 0.5 Torr to 20 Torr.

Figure 6A:
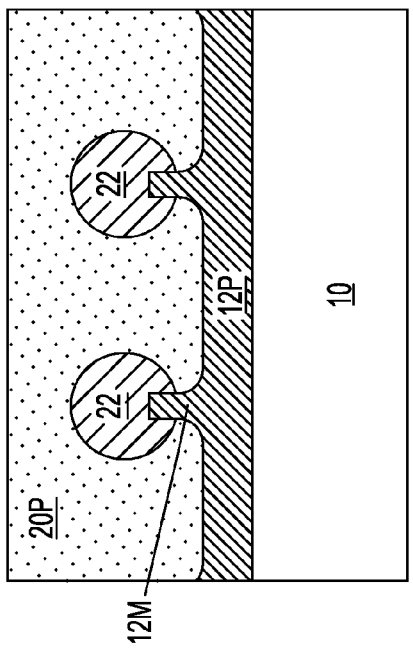
FIG. 6A is a cross sectional view of the exemplary semiconductor structure of FIG. 5A after performing solid phase epitaxy to provide a plurality of single crystalline semiconductor nanoballs in contact with a surface of each mesa structure of the remaining portion of the insulator layer and in accordance with an embodiment of the present application.

Referring now to FIG. 6A, there is illustrated the exemplary semiconductor structure of FIG. 5A after performing solid phase epitaxy to provide a plurality of single crystalline semiconductor nanoballs 22 in contact with a surface of each mesa structure 12M of the remaining portion of the insulator layer (i.e., insulator portion 12P). As is shown FIG. 6A, a portion of the mesa structure 12M protrudes into a portion of each single crystalline semiconductor nanoball 22. In this embodiment, the amorphous semiconductor material layer 20 and each single crystalline semiconductor material portion 14P are comprised of a same semiconductor material. In such an embodiment, the entirety of each single crystalline semiconductor nanoball 22 is composed of a single semiconductor material, i.e., silicon or a silicon germanium alloy.

Figure 6C:
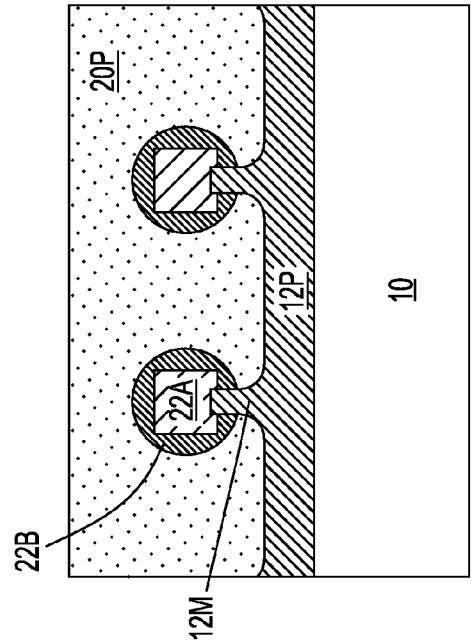
FIG. 6C is view of the exemplary semiconductor structure of FIG. 5A after performing solid phase epitaxy to provide a plurality of single crystalline semiconductor nanoballs in contact with a surface of each mesa structure of the remaining portion of the insulator layer and in accordance with an embodiment of the present application.
Figure 6B:
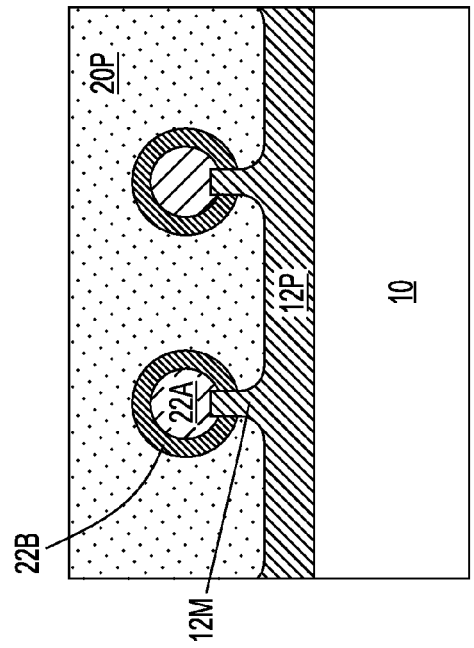
FIG. 6B is a cross sectional views of the exemplary semiconductor structure of FIG. 5B after performing solid phase epitaxy to provide a plurality of single crystalline semiconductor nanoballs in contact with a surface of each mesa structure of the remaining portion of the insulator layer in accordance with an embodiment of the present application.

Referring now to FIG. 6B, there is illustrated exemplary semiconductor structure of FIG. 5B after performing solid phase epitaxy to provide a plurality of single crystalline semiconductor nanoballs 22A/22B in contact with a surface of each mesa structure 12M of the remaining portion 12P of the insulator layer in accordance with an embodiment of the present application. As is shown FIG. 6B, a portion of the mesa structure 12M protrudes into a portion of each single crystalline semiconductor nanoball 22A/22B; typically into a portion of the core 22A. In some embodiments, the single crystalline semiconductor material 14P (and hence the reshaped portions 14R) and the amorphous semiconductor layer 20 are composed of different semiconductor materials. In such an embodiment, the amorphous semiconductor material layer 20 is comprised of a second semiconductor material that is different from the first semiconductor material that provides each single crystalline semiconductor material portion 14P (and hence each reshaped portion 14R). In such an embodiment, each single crystalline semiconductor nanoball is composed of core 22A of the first semiconductor material and a shell 22B of the second semiconductor material. In one example, shell 22B may be composed of a silicon germanium alloy and core 22A may be composed of silicon. If the core 22A and the shell 22B are different semiconductor materials (e.g., Si core and SiGe shell), the core 22A and the shell 22B have a same lattice constant at their interface. This means that the shell 22B and the core 22A may be strained. The strain distribution between the core 22A and the shell 22B depends on the material properties (such as Young's modulus), the lattice constants of unstrained materials, and the dimensions of the shell 22B and core 22A. In some embodiments and upon subsequent removal of the non-crystallized portion of the amorphous semiconductor layer, a further thermal anneal may be employed to thermally mix the core 22A and shell 22B and provide single crystalline semiconductor nanoballs of a same semiconductor material, i.e., mixed product of the first and second semiconductor materials.

Referring now to FIG. 6C, there is illustrated the exemplary semiconductor structure of FIG. 5A after performing solid phase epitaxy to provide a plurality of single crystalline semiconductor nanoballs 22A/22B in contact with a surface of each mesa structure 12M of the remaining portion 12P of the insulator layer and in accordance with an embodiment of the present application. As is shown FIG. 6C, a portion of the mesa structure 12M protrudes into a portion of each single crystalline semiconductor nanoball 22A/22B;

typically into a portion of the core 22A. In this embodiment, the amorphous semiconductor material layer 20 comprises a different semiconductor material that each single crystalline semiconductor material portion 14P. As shown, the core 22B maintains the original shape of the single crystalline semiconductor material portion 14P, while the shell 22B is circular in shape. This embodiment of the present application demonstrates a case in which there is a difference in crystallization rates (corners crystallize slower than planar top surfaces and sidewall surfaces).

During solid phase epitaxy of any of the embodiments mentioned above, a portion of the amorphous semiconductor material layer 20 that is near and in contact with each single crystalline semiconductor material portion 14P (or reshaped portion 14R) crystallizes, and collectively the crystallized portion of the amorphous semiconductor material layer 20 and the single crystalline semiconductor material portion 14P (or reshaped portion 14R) merge and provide a single crystalline semiconductor material nanocrystal whose crystal orientation matches the original crystal orientation of the single crystalline semiconductor material layer 14. In the illustrated embodiment of FIGS. 6A-6C, the single crystalline semiconductor nanocrystal is a single crystalline semiconductor nanoball (22 or 22A/22B). It is noted that not all the amorphous semiconductor material layer 20 is crystallized during this step of the present application. Instead, an outer portion of the amorphous semiconductor material layer 20 remains after solid phase epitaxy. The outer portion of the amorphous semiconductor material layer that is not crystallized during this step of the present application may be referred to herein as a remaining non-crystallized portion of the amorphous semiconductor layer. This non-crystallized portion of the amorphous semiconductor layer is labeled as element 20P in the drawings of the present application.

In some embodiments of the present application, each single crystalline semiconductor nanocrystal, e.g., nanoball 22 (or 22A/22B), that is formed in the present application has a diameter of less than 20 nm, and is spaced apart for its nearest neighboring single crystalline semiconductor nanocrystal by a distance of 20 nm or less. Other diameters and spacing that is lesser than, or greater than, the aforementioned ranges can also be obtained in the present application. In some embodiment, each nanoball 22 (or 22A/22B) that is formed has a length of 20 nm or less. Other lengths that are lesser than, or greater than, the aforementioned length range may also be obtained in the present application.

In the present application, solid phase epitaxy comprises a thermal anneal process that can be carried out in an inert ambient such as, for example, He, Ar and/or Ne. Depending on the material properties, the thermal anneal can be performed at a temperature from 550° C. to 1350° C. for silicon and a silicon germanium alloy with germanium concentration less than 30 atomic %. For a silicon germanium alloy having a higher atomic % germanium or pure Ge case, the SPE temperature will be lower. The thermal anneal may include a furnace anneal, a rapid thermal anneal, laser anneal, flash anneal, or any other anneal that can cause solid phase epitaxy to occur.

Referring now to FIGS. 7A-7B, there are illustrated the exemplary semiconductor structure of FIG. 6A after removing the remaining portion of the amorphous semiconductor material layer (i.e., amorphous semiconductor material portion 20P). Although the present application describes and illustrates the removal of the amorphous semiconductor material portion 20P from the exemplary semiconductor structure shown in FIG. 6A, the amorphous semiconductor material portion 20P can also be removed from the exemplary semiconductor structure shown in FIGS. 6B-6C utilizing the etching process described below.

The amorphous semiconductor material portion 20P may be removed utilizing an etching process that selectively removes an amorphous semiconductor material relative to the single crystalline semiconductor material (or materials) that provides the nanoballs 22 (or 22A/22B). In one example, hydrochloric (HCl) gas can be used to remove the amorphous semiconductor material portion 20P from the structures shown in FIGS. 6A, 6B and 6C.

In some embodiments of the present application, and after removing the amorphous semiconductor material portion 20P from the exemplary semiconductor structure shown in FIG. 6B, the exemplary semiconductor structure can be subjected to another anneal which thermally mixes the core 22A and shell 22B as mentioned above. This another anneal can be performed utilizing a temperature and one of the ambient mentioned above for the solid phase epitaxy process.

Referring now to FIG. 8, there is illustrated the exemplary semiconductor structure of FIG. 7A after forming a functional gate structure 24 straddling each single crystalline semiconductor nanoball 22. Although the present application describes and illustrates the formation of a single functional gate structure 24, a plurality of functional gate structures 24 can be formed. The term "straddling" denotes that the functional gate structure 24 is formed across each single crystalline semiconductor nanocrystal (i.e., each single crystalline semiconductor nanoball 22) such that a first portion of each functional gate structure 24 is present on one side of the single crystalline semiconductor nanocrystal, and a second portion of each functional gate structure 24 is present on another side of the single crystalline semiconductor nanocrystal.

As shown in FIG. 8, a portion of the functional gate structure 24 is located on the insulator layer portion 12P and sidewall surfaces of the mesa structure 12M as well surrounding each single crystalline semiconductor nanoball 22. By "functional gate structure" it is meant a permanent gate structure used to control output current (i.e., flow of carriers in the channel) of a semiconducting device through electrical or magnetic fields. Each functional gate structure 24 that is formed includes a gate material stack of, from bottom to top, a gate dielectric portion 26 and a gate conductor portion 28.

The gate dielectric portion 26 comprises a gate dielectric material. The gate dielectric material that provides the gate dielectric portion 26 can be an oxide, nitride, and/or oxynitride. In one example, the gate dielectric material that provides the gate dielectric portion 26 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as the gate dielectric portion 26.

The gate dielectric material used in providing the gate dielectric portion 26 can be formed by any deposition process including, for example, chemical vapor deposition (CVD), plasma enhanced chemical vapor deposition (PECVD), physical vapor deposition (PVD), sputtering, or atomic layer deposition. In some embodiments and when different functional gate structures are formed, a first set of functional gate structure may comprise a first gate dielectric portion, while a second set of functional gate structures may comprise a second gate dielectric portion that differs in composition from the first gate dielectric portion. When a different gate dielectric material is used for the gate dielectric portions, block mask technology can be used. In one embodiment of the present application, the gate dielectric material used in providing the gate dielectric portion 26 can have a thickness in a range from 1 nm to 10 nm. Other thicknesses that are lesser than, or greater than, the aforementioned thickness range can also be employed for the gate dielectric material.

The gate conductor portion 28 comprises a gate conductor material. The gate conductor material used in providing the gate conductor portion 28 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, gate conductor portion 28 may comprise an nFET gate metal. In other embodiments, gate conductor portion 28 may comprise a pFET gate metal.

The gate conductor material used in providing the gate conductor portion 28 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for gate conductor portions of more than one functional gate structure, block mask technology can be used. In one embodiment, the gate conductor material used in providing the gate conductor portion 28 has a thickness from 1 nm to 100 nm. Other thicknesses that are lesser than, or greater than, the aforementioned thickness range can also be employed for the gate conductor material used in providing the gate conductor portion 28.

If present, the gate cap portion comprises a gate cap material. The gate cap material that provides each gate cap portion may include one of the dielectric materials mentioned above for hard mask material. In one embodiment, each gate cap portion comprises silicon dioxide, silicon nitride, and/or silicon oxynitride. The dielectric material that provides each gate cap portion can be formed utilizing a conventional deposition process such as, for example, chemical vapor deposition or plasma enhanced chemical vapor deposition. The dielectric material that provides each gate cap portion can have a thickness from 5 nm to 20 nm. Other thicknesses that are lesser than, or greater than, the aforementioned thickness range can also be employed as the thickness of the dielectric material that provides each gate cap portion.

The functional gate structure 24 can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching.

In other embodiments of the present application, a sacrificial gate structure is first provided instead of the functional gate structure 24. By sacrificial gate structure" it is meant a material or material stack that serves as a placeholder for a subsequently formed functional gate structure. In such a process, the functional gate structure is formed after the source/drain structures have been formed. In such an embodiment, the gate dielectric portion of the functional gate structure may be U-shaped. By "U-shaped" it is meant a material that includes a bottom horizontal surface and a sidewall surface that extends upward from the bottom horizontal surface. When employed, the sacrificial gate structure may include a sacrificial gate dielectric portion, a sacrificial gate material portion and a sacrificial gate cap portion. In some embodiments, the sacrificial gate dielectric portion and/or sacrificial gate cap portion may be omitted. The sacrificial gate dielectric portion includes one of the dielectric materials mentioned above for the gate dielectric portion 26. The sacrificial gate material portion includes one of the gate conductor materials mentioned above for gate conductor portion 28. The sacrificial gate cap portion includes one of the gate cap material mentioned above for gate cap portions. The sacrificial gate structures can be formed by deposition of the various material layers and then patterning the resultant sacrificial material sack by utilizing, for example, lithography and etching.

After forming the gate structure (functional and/or sacrificial gate structure) source/drain regions (not shown) can be formed utilizing an epitaxial growth process from exposed portions of each single crystalline semiconductor nanocrystal (i.e., nanoball 22) that are not protected by the gate structure; the source/drain regions would by located within a plane that runs into and out of the drawing illustrated in FIG. 8. The source/drain regions comprise any semiconductor material including, for example, Si, Ge or silicon germanium alloys. The semiconductor material that provides the source/drain regions is doped with an n-type dopant or a p-type dopant as are well known those skilled in the art. The doping may be achieved during the epitaxial growth of the semiconductor material that provides the source/drain regions or after epitaxial growth of an intrinsic semiconductor material by utilizing ion implantation or gas phase doping.

In some embodiments, and prior to formation of the source/drain regions, a gate spacer (also not shown) can be formed on exposed sidewalls of the gate structure (functional gate structure and/or sacrificial gate structure). The gate spacer can be formed by deposition of a gate spacer material, such as, for example, a dielectric oxide, and then etching the deposited gate spacer material by utilizing a spacer etch.

Referring now to FIG. 9, there is illustrated the exemplary semiconductor structure of FIG. 3 after removing each hard mask portion 16P from above each single crystalline semiconductor material portion 14P and forming an amorphous semiconductor material layer 20 surrounding, and in contact with, exposed surfaces (i.e., sidewall and topmost) of each single crystalline semiconductor material portion 14P in accordance with alternative embodiment of the present application. The removal of each hard mask portion 16P from atop each single crystalline semiconductor material portion 14P includes one of the techniques mentioned for removing the hard mask portions 16P from the exemplary semiconductor structure shown in FIG. 4.

The amorphous semiconductor material layer 20 used in this embodiment of the present includes one of the semiconductor materials mentioned above for providing the amorphous semiconductor material layer 20 to the exemplary semiconductor structure shown in FIG. 5. Also, one of the deposition techniques mentioned above in providing the amorphous semiconductor material layer 20 to the exemplary semiconductor structure shown in FIG. 5 can also be used for providing the providing the amorphous semiconductor material layer 20 to the exemplary semiconductor structure shown in FIG. 9. In some embodiments, reshaping of the single crystalline semiconductor material portion 14P may be performed prior to forming the amorphous semiconductor layer 20.

Referring now to FIG. 10, there is illustrated the exemplary semiconductor structure of FIG. 11 after performing solid phase epitaxy to provide a plurality of single crystalline semiconductor nanoballs 22 on the insulator layer 12. In the illustrated embodiment, each single crystalline semiconductor nanoball 22 is entirely composed of a single semiconductor material. Although this embodiment of the present application describes and illustrates single crystalline semiconductor nanoballs that are entirely composed of a single semiconductor material, this embodiment of the application can also be used to form a core/shell single crystalline semiconductor nanocrystal as described above in FIG. 6B or FIG. 6C.

Solid phase epitaxy that is used in this embodiment of the present application is the same as described above in providing the structure shown in FIGS. 6A, 6B and 6C of the present application. It is again noted that not all the amorphous semiconductor material layer 20 is crystallized during this step of the present application. Instead, an outer portion of the amorphous semiconductor material layer 20 remains after solid phase epitaxy.

Referring now to FIG. 11, there is illustrated the exemplary semiconductor structure of FIG. 10 after removing the remaining portion of the amorphous semiconductor material layer (i.e., the amorphous semiconductor material portion 20P) from the structure and after etching the exposed surface of the insulator layer 12 to provide a mesa structure 12M located beneath each single crystal semiconductor nanoball 22 and extending upward from a remaining portion of the insulator (i.e., insulator layer portion 12P). An undulating surface 12S, as described above in the previous embodiment of the present application, is also formed by this etch.

The removal of amorphous semiconductor material portion 20P from the structure may be performed utilizing an etching process that selectively removes an amorphous semiconductor material relative to the single crystalline semiconductor material (or materials) that provide the single crystalline semiconductor nanoballs 22. In one example, hydrochloric (HCl) gas can be used to remove the amorphous semiconductor material portion 20P from the structure shown in FIG. 10.

The etching of the insulator layer 12 that can be used in this embodiment of the present application is the same as that described above in providing the exemplary semiconductor structure shown in FIG. 4. Since the etching of the insulator layer 12 occurs after solid phase epitaxy, each single crystalline semiconductor nanocrystal (i.e., nanoball 22) that is formed has a flat bottommost surface that rests upon, i.e., is in direct contact with, a topmost surface of an underlying mesa structure 12M. Like the previous embodiment, the mesa structure 12M and the insulator layer portion 12P are of unitary construction and are of the same material.

The exemplary semiconductor structure shown in FIG. 11 can be further processed to include a functional gate structure straddling each single crystalline semiconductor nanocrystal (i.e., nanoball 22).

Figure 12B:
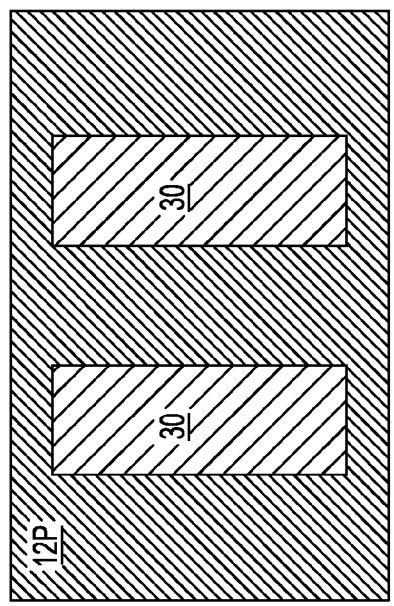
FIGS. 12A, 12B and 12C are various views of another exemplary semiconductor structure containing a plurality of nanorods located on a surface of an insulator layer that can be formed utilizing the processing steps of the present application.
Figure 12A:
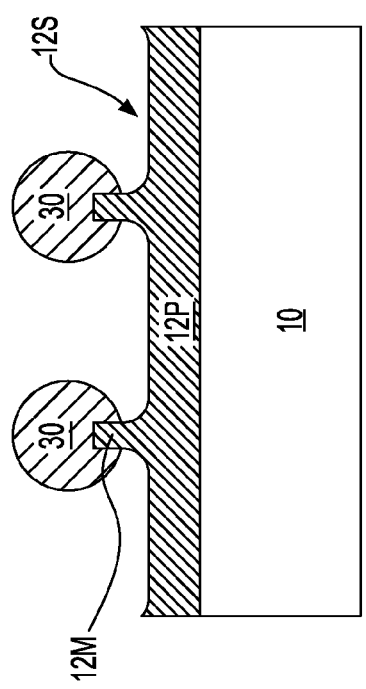
Figure 12C:
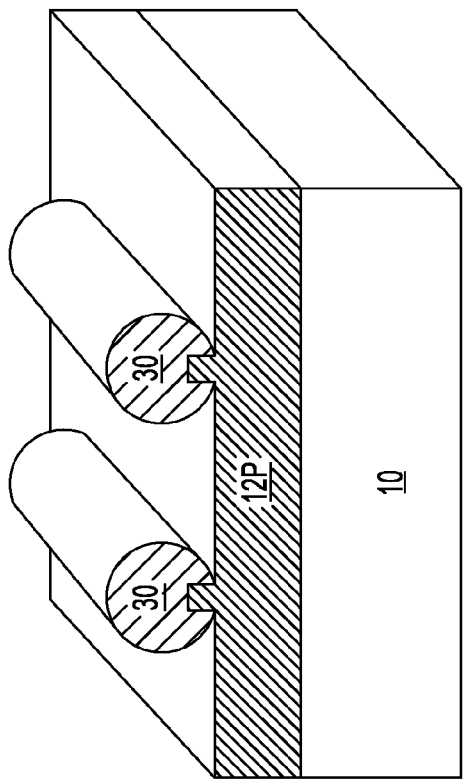

Referring now to FIGS. 12A, 12B and 12C, there are illustrated various views of another exemplary semiconductor structure containing a plurality of nanorods 30 located on a surface of an insulator layer 12 that can be formed utilizing the processing steps of the present application.

The plurality of nanorods 30 can be formed by first providing the exemplary semiconductor structure shown in FIG. 2. The structure shown in FIG. 2 is then patterned utilizing one of the above mentioned patterning processes to form a plurality of stripes or fins (i.e., patterned nanostructures) extending upward from the insulator layer 12. In accordance with the present application each stripe that is formed contains, from bottom to top, a single crystalline semiconductor material portion 14P and a hard mask portion 16P. Each single crystalline semiconductor material portion 14P represents a remaining portion of the single crystalline semiconductor material layer, while each hard mask portion 16P represents a remaining portion of the hard mask layer 16.

As used herein, a "stripe" refers to a patterned nanostructure whose length is greater than its width. The width of each stripe 18 that can be formed in the present application can be from 6 nm to 10 nm. Other widths that are lesser than, or greater than, the range mentioned above can also be employed in the present application for each stripe 18. The length of each stripe that can be formed in the present application is from 50 nm up to and including 2000 nm. Other lengths that are lesser than, or greater than, the aforementioned range may also be employed in the present application. Each stripe that is formed at this point of the present application is spaced apart from its nearest neighboring stripe by a distance of from 10 nm to 50 nm; this distance can be measured from a central portion of one of the stripes to a central portion of a neighboring stripe. Other spacing distances that are lesser than, or greater than, the aforementioned range may also be employed in the present application.

After forming the plurality of stripes and in one embodiment of the present application, the processing as described in FIGS. 4, 5A, 6A, 7 and 8 can be performed to provide the structure shown in FIGS. 12A, 12B and 12C: other variations such as, shown in FIGS. 6B, 6B and 6C are possible as well. During solid phase epitaxy, single crystalline semiconductor nanorods 30 are formed. In such an embodiment, a portion of the mesa structure 12M protrudes into each of the nanorods 30; See FIGS. 12A and 12C. In other embodiments in which the processing shown in FIGS. 9-11 is employed, the mesa structure 12M does not protrude into the nanorods 30. Each nanorod 30 that is formed in the present application has a diameter of less than 20 nm, and they are spaced apart from each other by a distance of 20 nm or less. The exemplary semiconductor structure shown in FIGS. 12A, 12B and 12C can be further processed to include a functional gate structure straddling each single crystalline semiconductor nanocrystal (i.e., nanorod 30).

It is noted that while the present application describes and illustrates the formation of functional gate structures straddling each of the single crystalline semiconductor nanocrystals (nanoballs 22 or nanorods 30) the present application is not limited to only forming such semiconductor devices. Instead, other semiconductor devices can be formed and used in conjunction with the single crystalline semiconductor nanocrystals of the present application.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:

forming a plurality of spaced apart pillars on an insulator layer, wherein each spaced apart pillar of the plurality of spaced apart pillars comprises a single crystalline semiconductor material portion;

forming an amorphous semiconductor material layer in direct physical contact with at least a topmost surface and each sidewall surface of each single crystalline semiconductor material portion of said plurality of spaced apart pillars;

performing a thermal anneal to crystallize a portion of said amorphous semiconductor material layer that is in contact with each single crystalline semiconductor material portion and to convert said crystallized portion of said amorphous semiconductor material and each single crystalline semiconductor portion into a plurality of single crystalline semiconductor nanocrystals; and removing a remaining non-crystallized portion of said amorphous semiconductor material layer.

2. The method of claim 1, wherein prior to said forming said amorphous semiconductor material layer, said insulator layer is etched to provide an insulator layer portion having an undulating surface and containing a mesa structure located directly beneath said single crystalline single material portion, wherein said mesa structure has vertical sidewalls that do not extend beyond vertical sidewalls of said single crystalline single material portion.

3. The method of claim 2, wherein after performing said thermal anneal, a portion of said mesa structure of said insulator layer portion protrudes into a lower portion of each of said single crystalline semiconductor nanocrystals.

4. The method of claim 1, wherein after said removing said remaining portions of said amorphous semiconductor layer, said insulator layer is etched to provide an insulator layer portion having an undulating surface and containing a mesa structure located directly beneath each of said single crystalline semiconductor nanocrystals, wherein said mesa structure has vertical sidewalls that do not extend beyond vertical sidewalls of said single crystalline semiconductor nanocrystals.

5. The method of claim 1, wherein each of said single crystalline semiconductor nanocrystals has a diameter of less than 20 nm and is spaced apart for its nearest neighboring single crystalline semiconductor nanocrystal by a distance of 20 nm or less.

6. The method of claim 5, wherein each of said single crystalline semiconductor nanocrystals is a nanoball or a nanorod.

7. The method of claim 1, wherein said forming said plurality of spaced apart pillars comprises:

providing a semiconductor-on-insulator substrate of, from bottom to top, a handle substrate, said insulator layer, and a single crystalline semiconductor material layer;

forming a hard mask layer on a surface of said single crystalline semiconductor material layer;

patterning said hard mask layer and said single crystalline semiconductor material layer to provide a patterned stack of, from bottom to top, said single crystalline semiconductor material portion and a remaining portion of said hard mask layer; and removing said remaining portion of said hard mask layer.

8. The method of claim 7, wherein after removing said remaining portion of said hard mask layer and prior to forming said amorphous semiconductor layer, said single crystalline semiconductor material portion is reshaped by annealing.

9. The method of claim 1, wherein said amorphous semiconductor material layer and said single crystalline semiconductor material portion each comprises a first semiconductor material, and wherein an entirety of each of said single crystalline semiconductor nanocrystals comprises said first semiconductor material.

10. The method of claim 1, wherein said single crystalline semiconductor material portion comprises a first semiconductor material and said amorphous semiconductor material layer comprises a second semiconductor material that is different from the first semiconductor material, and wherein each of said single crystalline semiconductor nanocrystals comprises a core of said first semiconductor material and a shell of said second semiconductor material and wherein a strain is present between said core and said shell.

* * * * *